United States Patent
Horning et al.

(10) Patent No.: US 9,227,835 B2
(45) Date of Patent: Jan. 5, 2016

(54) VIBRATION ISOLATION INTERPOSER DIE

(75) Inventors: Robert D. Horning, Savage, MN (US);
Ryan Supino, Loretto, MN (US)

(73) Assignee: Honeywell International Inc., Morristown, NJ (US)

(*) Notice: Subject to any disclaimer, the term of this patent is extended or adjusted under 35 U.S.C. 154(b) by 1013 days.

(21) Appl. No.: 13/299,485

(22) Filed: Nov. 18, 2011

(65) Prior Publication Data

US 2012/0130671 A1 May 24, 2012

Related U.S. Application Data

(60) Provisional application No. 61/416,485, filed on Nov. 23, 2010.

(51) Int. Cl.
*B81B 7/00* (2006.01)

(52) U.S. Cl.
CPC ......... *B81B 7/0016* (2013.01); *B81B 2201/025* (2013.01); *B81B 2207/07* (2013.01)

(58) Field of Classification Search
CPC .. B81B 7/0016; B81B 2201/0235–2201/0242; B81B 2207/07
See application file for complete search history.

(56) References Cited

U.S. PATENT DOCUMENTS

| | | | |
|---|---|---|---|
| 4,129,042 A | | 12/1978 | Rosvold |
| 4,558,397 A | * | 12/1985 | Olsson .......................... 361/772 |
| 5,138,430 A | * | 8/1992 | Gow, 3rd ............ H01L 23/3121 257/712 |
| 5,315,104 A | * | 5/1994 | Plumb ............. H01L 31/022408 250/214.1 |
| 6,819,822 B2 | * | 11/2004 | Behin et al. ....................... 385/18 |
| 7,679,171 B2 | | 3/2010 | Anderson et al. |
| 7,939,937 B2 | | 5/2011 | Holzmann et al. |
| 8,276,446 B2 | | 10/2012 | Ulm et al. |
| 2002/0165669 A1 | * | 11/2002 | Pinto et al. ..................... 701/213 |
| 2002/0171133 A1 | * | 11/2002 | Mok et al. ...................... 257/678 |
| 2006/0205106 A1 | * | 9/2006 | Fukuda et al. ................... 438/52 |
| 2007/0029629 A1 | * | 2/2007 | Yazdi ............................. 257/414 |
| 2009/0194860 A1 | | 8/2009 | Holzmann et al. |
| 2010/0212426 A1 | | 8/2010 | Oshio |
| 2012/0119373 A1 | * | 5/2012 | Hunt ............................. 257/774 |
| 2013/0194770 A1 | * | 8/2013 | Bernstein et al. ............. 361/808 |

FOREIGN PATENT DOCUMENTS

| | | |
|---|---|---|
| DE | 102006022807 | 11/2007 |
| DE | 102009000574 | 8/2010 |
| EP | 1132743 A2 * | 9/2001 |

(Continued)

OTHER PUBLICATIONS

European Patent Office, "Office Action", "from Foreign Counterpart of U.S. Appl. No. 13/299,485", Dec. 12, 2013, pp. 1-5, Published in: EP.

(Continued)

*Primary Examiner* — Mischita Henson
(74) *Attorney, Agent, or Firm* — Fogg & Powers LLC

(57) ABSTRACT

In an example, an interposer chip is provided. The interposer chip includes a base portion and a chip mounting portion. The interposer chip also includes one or more flexures connecting the base portion to the chip mounting portion. Additionally, a first plurality of projections extends from the base portion towards the chip mounting portion, and a second plurality of projections extends from the chip mounting portion towards the base portion and extending into interstices formed by first plurality of projections.

20 Claims, 8 Drawing Sheets

(56) References Cited

FOREIGN PATENT DOCUMENTS

| JP | 2002071353 | 8/2002 |
| JP | 2010223952 | 10/2010 |

OTHER PUBLICATIONS

European Patent Office, "European Search Report", "from Foreign Counterpart of U.S. Appl. No. 13/299,485", Dec. 4, 2013, p. 1-3, Published in: EP.

European Patent Office, "EPO Communication Under Rule 71(3)", "from EP Counterpart of U.S. Appl. No. 13/299,485", Jun. 12, 2014, pp. 1-28, Published in: EP.

Japanese Patent Office, "Notice of Reasons for Rejection for Japanese Patent Application No. 2011-255390", "from Foreign Counterpart to U.S. Appl. No. 13/299,485", Apr. 16, 2015, pp. 1-6, Published in: JP.

Chinese Patent Office, "First Office Action for CN Application No. 201110456837.3", "from Foreign Counterpart to U.S. Appl. No. 13/299,485", Apr. 1, 2015, pp. 1-22, Published in: CN.

* cited by examiner

VIBRATION ISOLATION INTERPOSER DIE

CROSS-REFERENCE TO RELATED APPLICATIONS

This application claims the benefit of priority to U.S. Provisional Application No. 61/416,485, filed on Nov. 23, 2010, the disclosure of which is incorporated herein by reference.

BACKGROUND

Sensing systems that are used in harsh environments usually need some form of isolation from that environment. For example, an inertial measurement unit (IMU) is often subjected to vibration and/or large shocks. Therefore, a vibration isolation system is typically used to damp out the vibration and/or large shocks from the IMU.

Conventional micro-electro-mechanical system (MEMS) IMUs can include a vibration isolator that separates the IMU housing from the internal components. This vibration isolator is typically an elastomeric material that can both absorb and damp a significant amount of vibration (e.g., approximately critically damped) over a wide temperature range (−55 degrees C. to 85 degrees C.).

SUMMARY

In an example, an interposer chip is provided. The interposer chip includes a base portion and a chip mounting portion. The interposer chip also includes one or more flexures connecting the base portion to the chip mounting portion. Additionally, a first plurality of projections extends from the base portion towards the chip mounting portion, and a second plurality of projections extends from the chip mounting portion towards the base portion and extending into interstices formed by first plurality of projections.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
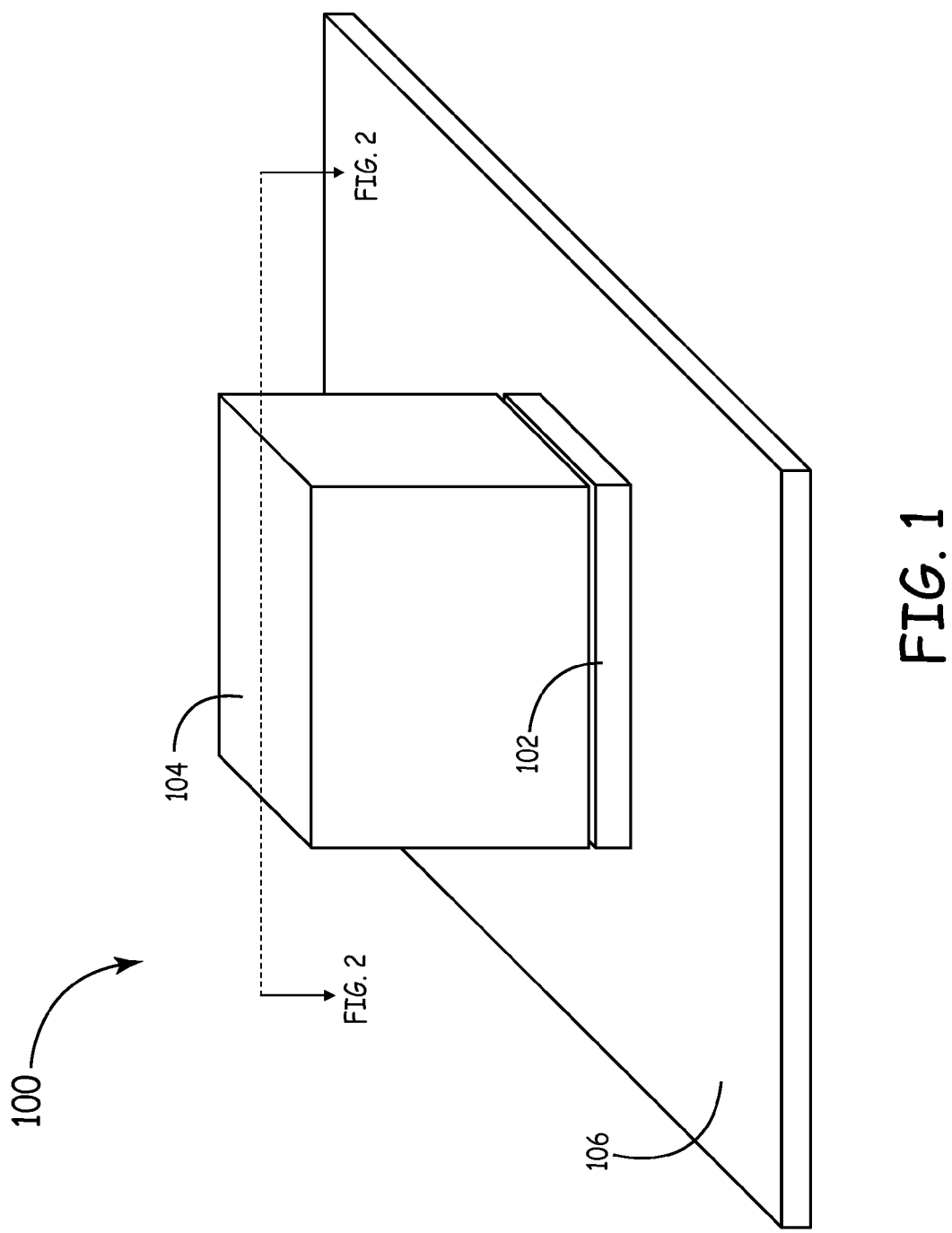
FIG. 1 is a perspective view of one example of a system including a vibration isolation interposer die.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

The embodiments described below relate to a vibration isolation interposer die that can be mounted between a sensor chip and a circuit board. The interposer die can include a base portion for mounting to a circuit board and a chip mounting portion for mounting a chip thereto. In some examples, the interposer die can also include one or more flexures connecting the base portion to the chip mounting portion and allowing relative motion there between. The interposer die can also provide squeeze film dampening of the relative motion between the base portion and the chip mounting portion.

FIG. 1 is a perspective view of one example of a system 100 including a vibration isolation interposer die 102. The vibration isolation interposer die 102 (also referred to herein as "interposer die" or simply "interposer") can be configured to be mounted between a chip 104 (e.g., a sensor chip) and a substrate 106 (e.g., a circuit board), and can function as the physical connection of the chip 104 to the substrate 106. Thus, the chip 104 can be attached to the interposer 102 which can be attached to the substrate 106. Accordingly, the interposer 102 can be attached to the substrate 106 and the chip 104 using any suitable die attach including solder, anodic bond, or other material. In some examples, electrical connections between the substrate 106 and the chip 104 can be routed through the interposer 102. In these examples, the interposer 102 can include suitable traces, through substrate vias, edge interconnects, or other interconnects as well as electrically conductive pads and the like to enable electrical connection to and between the chip 104 and the substrate 106. The interposer 102 can be composed of any suitable material, including silicon, glass, or other substrates.

Figure 2:
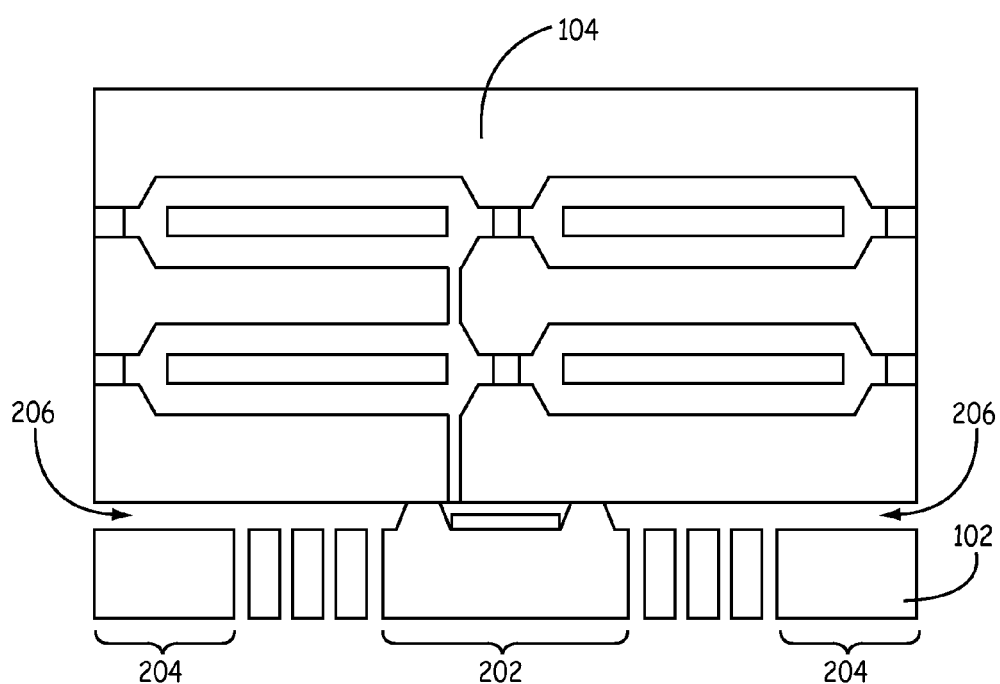
FIG. 2 is a cross-sectional view of one example of the interposer die and a sensor chip of FIG. 1 together which can comprise an inertial measurement unit (IMU).

FIG. 2 is a cross-sectional view of one example of the interposer 102 and the chip 104 of FIG. 1 together which can comprise an inertial measurement unit (IMU). In this example, the chip 104 can comprise a sensor chip that includes at least three micro-electromechanical system (MEMS) gyroscopes and at least three MEMS accelerometers, each gyroscope and accelerometer oriented to sense about one of three perpendicular axes (e.g., X, Y, and Z axis). The chip 104 can be mounted to a chip mounting portion 202 of the interposer 102. The interposer 102 can also include a base portion 204 configured to be mounted to the substrate 106.

Figure 3A:
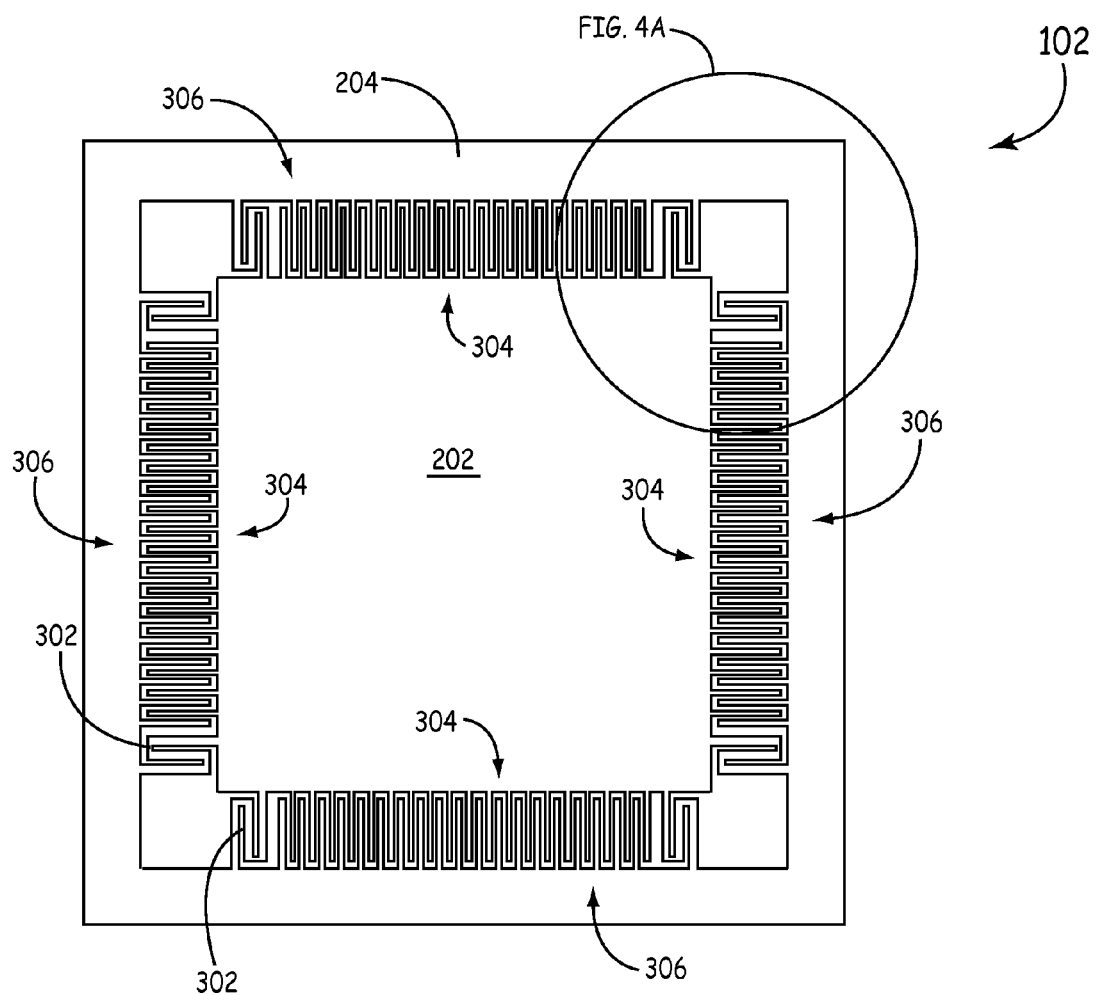
FIG. 3A is a top view of one example of the interposer of FIG. 1.
Figure 3B:
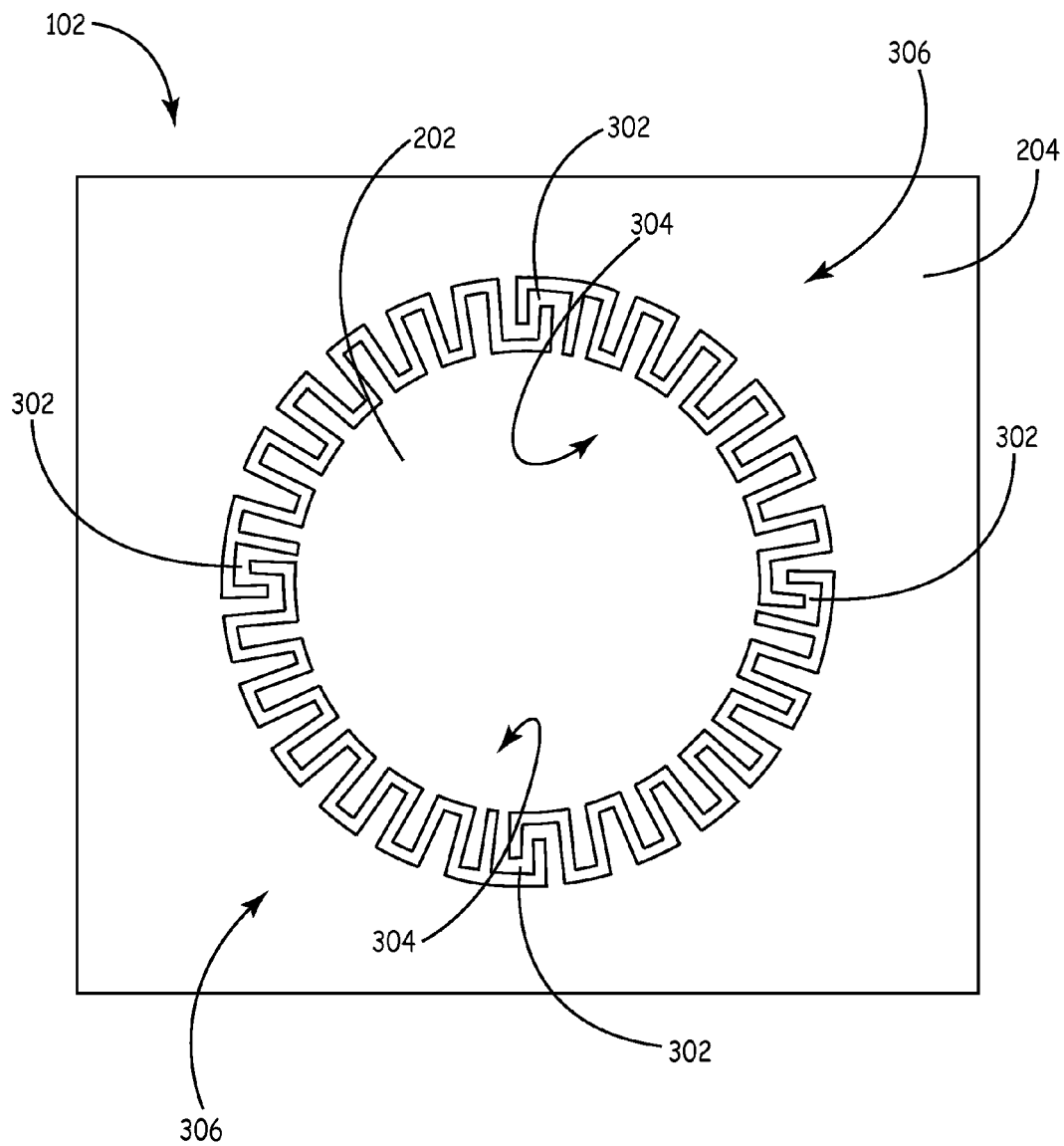
FIG. 3B is a top view of another example of the interposer of FIG. 1.
Figure 3C:
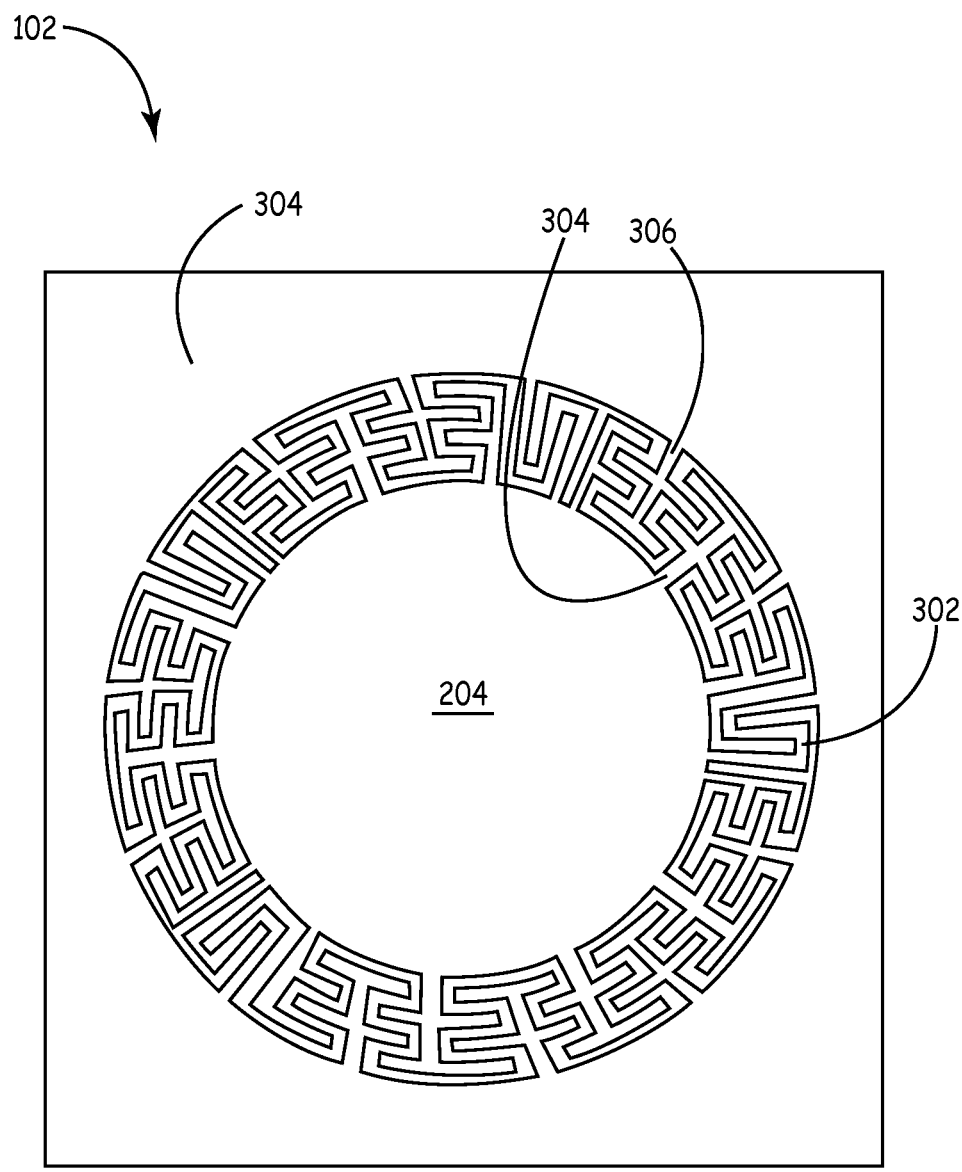
FIG. 3C is a top view of yet another example of the interposer of FIG. 1.

FIGS. 3A-3C are top views of examples of the interposer 102 of FIG. 1. As mentioned above, the interposer 102 can include a base portion 204 and a chip mounting portion 202. The interposer 102 can also include one or more flexures 302 (e.g., spring members) connecting the chip mounting portion 202 to the base portion 204.

The one or more flexures 302 can include an elongated folded member connected to the base portion 204 and the chip mounting portion 202. Moreover, the structure (e.g., the folded structure) of the one or more flexures 302 can enable the chip mounting portion 202 to move relative to the base portion 204. This movement can enable the interposer 102 to absorb stress caused by, for example, differences in coefficients of thermal expansion between the substrate 106 and the chip 104. Additionally, the flexures 302 can be designed such that frequencies in the substrate 106 above a desired frequency are substantially absorbed and are not passed on to the chip 104. In an example, the interposer 102 can have a low roll-off frequency such that frequencies below approximately 100 Hz are passed to the chip 104 and frequencies above 100 Hz are absorbed by the interposer 102. In some examples, the interposer 102 can be designed to absorb such vibration along three orthogonal axes including rotational vibration about the three orthogonal axes. Accordingly, the interposer 102 can function as a vibration isolator for the chip 104.

In an example, the interposer 102 can include a plurality of projections 304, 306 (e.g., fins) extending out from both the chip mounting portion 202 and the base portion 204. For example, a first plurality of projections 304 can comprise a plurality of generally planar structures, such as a fin, that are disposed such that they have faces that oppose one another. Moreover, the opposing faces can be near to one another and oriented such that relative movement between the chip mounting portion 202 and the base portion 204 causes opposing faces to move toward and away from one another. This movement of the opposing faces toward and away from one another can cause squeeze film damping as the two faces cause a fluid (e.g., a gas) to be pushed out and pulled into the gap between the two faces.

Figure 4A:
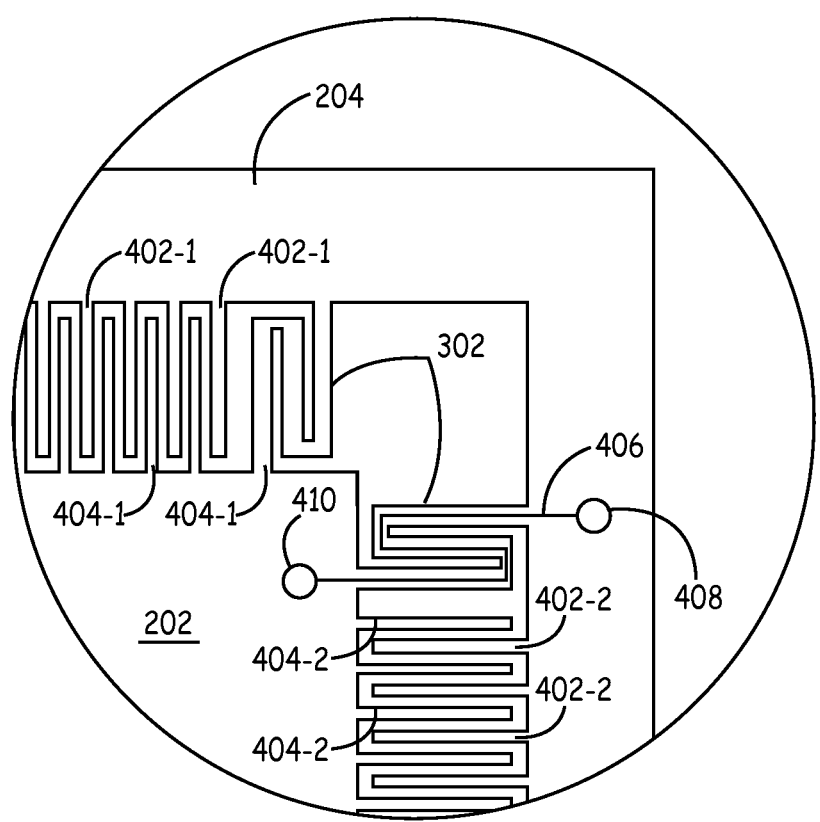
FIGS. 4A and 4B are views of a portion of the interposer of FIG. 3A illustrating, among other things, a plurality of projections for squeeze film damping.
Figure 4B:
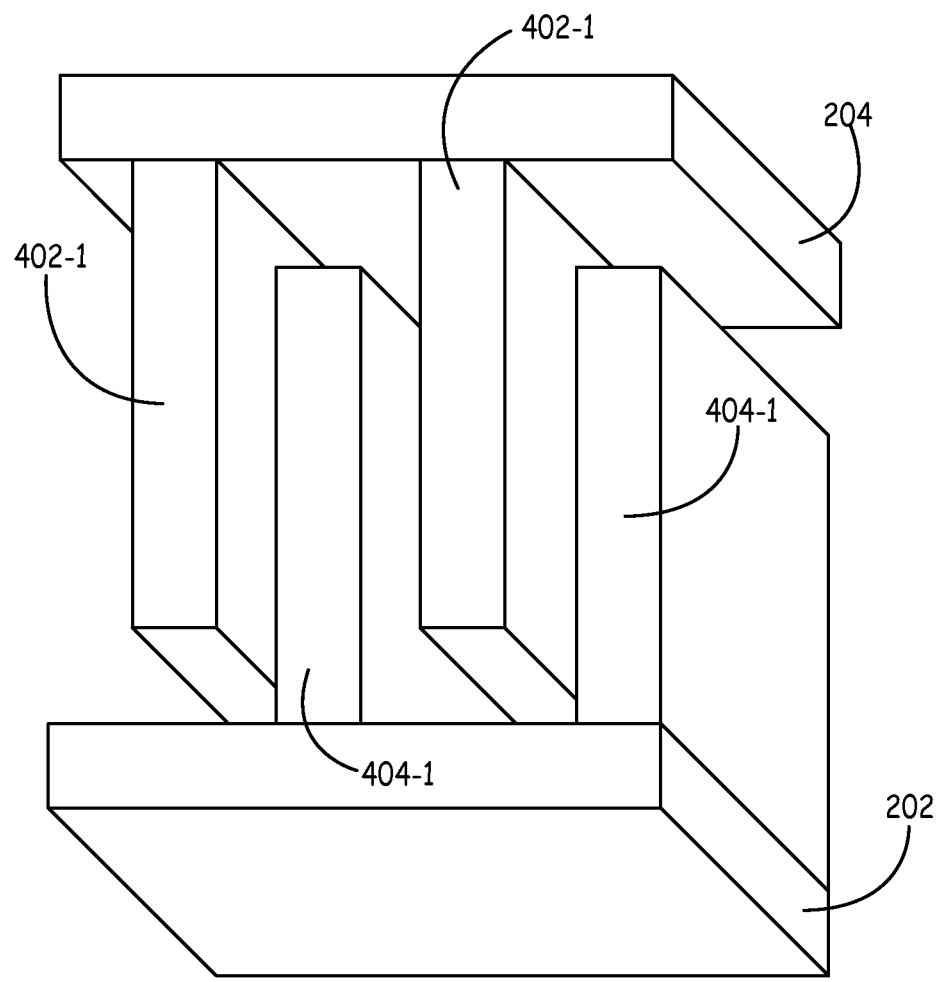

FIGS. 4A and 4B are views of a portion of the interposer 102 of FIG. 3A illustrating, among other things, the plurality of projections 304, 306. The plurality of projections include a first plurality of projections 402-1, 402-2 extending from the base portion 204 toward the chip mounting portion 202 and a second plurality of projections 404-1, 404-2 extending from the chip mounting portion 202 to the base portion 204. As shown in FIG. 4B, each of the first and second plurality of projections 402-1, 402-2, 404-1, 404-2 comprises a generally planar fin. The generally planar fins extend out perpendicularly from the base portion 204 or chip mounting portion 202 respectively. Moreover, the projections 402-1, 402-2 from one side extend into the interstices between the projections 404-1, 404-2 extending in the opposite direction. That is, the projections 402-1, 402-2 extending from the base portion 204 extend between the projections extending from the chip mounting portion 202 and the projections 404-1, 404-2 extending from the chip mounting portion 202 extend between the projections extending from the base portion 204. Accordingly, faces of the projections 402-1 oppose faces of the projections 404-1. Thus, when the projections 402-1 move towards and away from the projections 404-1, the fluid between the projections 402-1, 404-1 is pushed out and pulled into the gap between the projections. This fluid action creates squeeze film damping of the movement of the projections 402-1, 404-1. Since this squeeze film damping occurs due to movement of the projections 402-1, 404-1 in a direction towards and away from one another, the projections 402-1, 404-1 primarily provide damping in that direction, but may provide little or no damping in directions orthogonal to that direction. Accordingly, the interposer 102 includes multiple subsets of the projections, wherein the multiple subsets are oriented in different directions to provide damping in different directions. For example, a first subset of projections 402-1 can be oriented in a first direction and a second subset of projections 402-2 can be oriented in a second direction orthogonal to the first direction. The first subset of projections 402-1 extending from the base portion 204 has a corresponding third subset 404-1 extending from the chip mounting portion 202, and the second subset of projections 402-2 extending from the base portion 204 has a corresponding fourth subset of projections 404-2 extending from the chip mounting portion 202. Accordingly, the first subset 402-1 and the third subset 404-1 can provide damping in a first direction and a second subset 402-2 and the fourth subset 404-2 can provide damping in a second direction orthogonal to the first direction.

Referring back to FIGS. 3A-3C, the interposer 102 can include projections 304, 306 oriented in different directions. For example, in the interposer 102 of FIG. 3A, the projections 304, 306 are disposed in a rectangular (e.g., square) pattern. In FIG. 3A, a first plurality of projections 304 extend from the chip mounting portion 202 and a second plurality of projections 306 extend from the base portion 204. The first plurality of projections 304 includes a first subset extending in a first direction, a second subset extending in a second direction, a third subset extending in a third direction, and a fourth subset extending in a fourth direction, wherein the second direction is orthogonal to the first direction, the third direction extends opposite of the first direction, and the fourth direction extends opposite of the second direction. Additionally, the first, second, third, and fourth directions are within a plane formed by the interposer 102, that is, the planar surfaces of the first, second, third, and fourth subsets are oriented generally orthogonal to the plane formed by the interposer 102. The second plurality of projections 306 includes a fifth subset extending into the interstices of the first subset, a sixth subset extending into the interstices of the second subset, a seventh subset extending into the interstices of the third subset, and an eighth subset extending into the interstices of the fourth subset. Accordingly, the fifth subset extends in the third direction, the sixth subset extends in the fourth direction, the seventh subset extends in the first direction, and the eighth subset extends in the second direction. Thus, the interposer 102 can provide squeeze film damping in two orthogonal directions within the plane formed by the interposer 102.

FIG. 3B illustrates another example where the projections 304, 306 are disposed in a circular pattern. Accordingly, a first plurality of projections 304 extend outward radially from the chip mounting portion 202. A second plurality of projections 306 extend inward radially from the base portion 204. As shown, the second plurality of projections 306 extend into the interstices of the first plurality of projections 304. Four flexures 302 are shown flexibly connecting the base portion 204 to the chip mounting portion 202; however other numbers and/or orientations of flexures can be used. Accordingly, rotation of the chip mounting portion 202 with respect to the base portion 204 as well as lateral movement along the plane of the interposer 202 in most directions can be damped by the projections 304, 306.

FIG. 3C illustrates yet another example where the projections 304, 306 are disposed in a circular pattern and are oriented to damp movement radially outward and inward from the chip mounting portion 202. A first plurality of projections 304 extend from the chip mounting portion 202 and have faces that oppose corresponding faces on a second plurality of projections 306 extending from the base portion 204. The faces are oriented to damp movement radially outward and inward with respect to the chip mounting portion. Four flexures 302 are shown flexibly connecting the base portion 204 to the chip mounting portion 202; however other numbers and/or orientations of flexures can be used.

Specific examples of the pattern, orientation, number, and geometry of projections 304, 306 are provided in FIGS. 3A-3C. It should be understood, however, that other patterns, orientations, numbers, and geometries of projections 304, 306 can be used. In an example, the projections 304, 306 are disposed such that opposing faces are 10 microns or less apart from one another. In another example, the projections 304, 306 are disposed such that opposing faces are 5 microns or less apart. These distances can be used to achieve the desired squeeze film damping.

Referring back to FIG. 2, a gap 206 formed between the interposer 102 and the chip 104 can enable squeeze film damping in the direction orthogonal to the plane formed by the interposer 102. That is, movement of the base portion 204 (e.g., up and down as shown in FIG. 2) with respect to a chip mounting portion 202 can cause the fluid (e.g., air) within the gap 206 to be pushed out and pulled into the gap 206. This fluid movement can function to squeeze film damp movement in the direction orthogonal to the plane formed by the interposer 102 (e.g., the z-axis). In an example, the gap 206 between the interposer 102 and the sensor chip 104 is 10 microns or less. In another example, the gap 206 between the interposer 102 and the sensor chip 104 is 5 microns or less.

Referring back to FIG. 3A, in an example, the base portion 204 comprises the perimeter of the interposer 102 and the chip mounting portion 202 comprises an interior area of the interposer 102. The projections 304, 306 are disposed between the chip mounting portion 202 and the base portion 204. In an example, the one or more apertures (e.g., gaps) formed between the projections 304, 306 is exposed to air (e.g., exposed to the environment surrounding the interposer 102. In examples where air is used for squeeze film damping between the projections 304, 306, since air changes relatively slowly with temperature (compared to liquids or elastomers) the damping can be relatively constant over temperature. In other examples, a chip mounting portion can comprise the perimeter of the interposer and the base portion can comprise the interior area of the interposer. That is, in some examples the chip 104 can be mounted to the perimeter of interposer and the interposer can be mounted to a substrate 106 in an interior area thereof. In other examples, other configurations for the chip mounting portion and the base portion can be used.

In an example, the flexures 302 include a polymer to dampen resonance of the flexures 302. In any case, the projections 304, 306 can dampen movement (e.g., vibration) between the chip mounting portion 202 and the base portion 204.

In an example, the interposer 102 can be fabricated using semiconductor processes. For example, the interposer 102 can be formed by starting with a blank wafer having a plurality of future interpose dies thereon. Each of the interposer dies can be etched to form the apertures (e.g., gaps) between the base portion 204 and the chip mounting portion 202. The etching can also define the projections 304, 306 and the flexures 302. The wafer can then be singulated to form the individual interposer dies. An interposer die 102 can then be attached (e.g., bonded) to another chip 104 (e.g., a sensor chip) and/or a substrate 106 (e.g., a circuit board).

In an example, the interposer 102 can include electrical interconnects therethrough to electrically couple the chip 104 to the substrate 106. In an example, the electrical interconnects can include one or more traces 406 on one or more of the flexures 302. The traces 406 on the flexures can couple a connection 408 (e.g., a die pad) on the chip mounting portion 202 with a through substrate via (TSV) 410 on the base portion 204. The die pad 408 can be configured to couple to the chip 104 and the TSV 410 can be configured to couple to the substrate 106 on a bottom side of the interposer 102. The trace 406 can be configured such that it will withstand the movement associated with the flexure 302. Accordingly, the chip 104 can be electrically coupled to the substrate 106 through electrical interconnects on the interposer 102. In other examples, other electrical interconnects can be used including vertical interconnects on an edge of the interposer 102.

Figure 5:
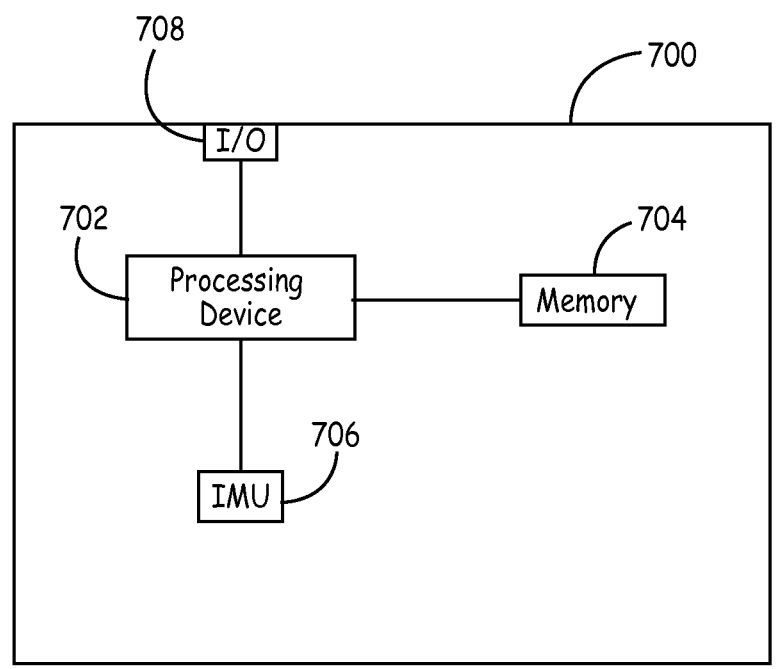
FIG. 5 is a block diagram of an electronic device including an IMU having a vibration isolation interposer die.

FIG. 5 is a block diagram of an electronic device 700 including an IMU 706 having a vibration isolation interposer die. The system 700 can include one or more processing devices 702 coupled to one or more memory devices 704. The one or more memory devices can include instruction which, when executed by the one or more processing devices 702 cause the processing devices 702 to implement navigation functions such as providing a hybrid or inertial navigation solution. The one or more processing devices 702 can also be coupled to an IMU 706 such as IMU 104 which can include an interposer die such as interposer die 102. Accordingly, sensors in the IMU 706 can be isolated from vibration and thermal shifting from a substrate (e.g., circuit board 106). The electronic device 700 can also include an input and/or output port 708 for sending and receiving signals with other devices. In some examples, the electronic device 700 can also include other sensors such as a satellite navigation system receiver. In an example, the electronic device 700 can be configured to be integrated into another larger apparatus such as an aircraft, vehicle, mobile phone, or other apparatus for which inertial data is desired.

The one or more processing devices 702 can include a central processing unit (CPU), microcontroller, microprocessor (e.g., a digital signal processor (DSP)), field programmable gate array (FPGA), application specific integrated circuit (ASIC) and other processing devices. The one or more processing devices 702 and the electronic device 700 can be "configured" to perform certain acts when the one or more memory devices 704 include instructions which, when executed by the one or more processing devices 702, cause the one or more processing devices 702 to perform those acts. These instructions can, for example, implement the functions of a navigation system. These instructions can be stored on any appropriate processor-readable medium used for storage of processor-readable instructions and/or data structures. This processor-readable medium can include the one or more memory devices 704 and/or other suitable media. Suitable processor readable media can include tangible media such as magnetic or optical media.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:
1. An interposer chip comprising:
   a die including:
      a base portion;
      a chip mounting portion;
      one or more flexures connecting the base portion to the chip mounting portion;
      a first plurality of projections extending from the base portion towards the chip mounting portion; and
      a second plurality of projections extending from the chip mounting portion towards the base portion and extending into interstices formed by first plurality of projections.
2. The interposer chip of claim 1, wherein the first and second plurality of projections are configured to squeeze film dampen movement of the chip mounting portion with respect to the base portion.

3. The interposer chip of claim 1, wherein the first plurality of projections include a first subset and a second subset of projections, the first subset extending in a first direction and the second subset extending in a second direction orthogonal to the first direction; and wherein the second plurality of projections include a third subset and a fourth subset of projections, the third subset extending into interstices formed by the first subset and the fourth subset extending into interstices formed by the second subset.

4. The interposer chip of claim 3, wherein the first plurality of projections include a fifth subset and a sixth subset of projections, the fifth subset extending in a direction opposite the first direction and the sixth subset extending in a direction opposite the second direction; and wherein the second plurality of projections include a seventh subset and an eighth subset of projections, the seventh subset extending into interstices formed by the fifth subset and the eighth subset extending into interstices formed by the sixth subset.

5. The interposer chip of claim 1, wherein the first and second plurality of projections extend in a circular pattern around the die between the base portion and the chip mounting portion.

6. The interposer chip of claim 1, wherein the first and second plurality of projections include generally planar structures disposed such that faces of the first plurality of projections oppose faces of the second plurality of projections.

7. The interposer chip of claim 6, wherein opposing faces are 10 microns or less apart from each other.

8. The interposer chip of claim 6, wherein the generally planar structures of the first and second plurality of projections are orthogonal to a plane formed by the die.

9. The interposer chip of claim 8, wherein a first subset of the generally planar structures of the first and second plurality of projections are oriented orthogonal to a first axis in the plane formed by the die and a second subset of the generally planar structures of the first and second plurality of projections are oriented orthogonal to a second axis in the plane formed by the die, the second axis orthogonal to the first axis.

10. The interposer chip of claim 1, wherein the one or more flexures include a polymer material to dampen resonance of the one or more flexures.

11. The interposer chip of claim 1, wherein the base portion comprises a perimeter of the die and the chip mounting portion comprises an interior area of the die.

12. The interposer chip of claim 1, wherein gaps formed between the first and second plurality of projections are exposed to an environment surrounding the die.

13. The interpose chip of claim 1, wherein the die is composed of silicon.

14. An inertial measurement unit (IMU) comprising:
an interposer die including:
a base portion configured to mount to a circuit board;
a chip mounting portion configured to have a chip mounted thereon;
one or more spring members connecting the base portion to the chip mounting portion;
wherein the base portion includes a first plurality of generally planar projections extending towards the chip mounting portion; and
wherein the chip mounting portion includes a second plurality of generally planar projections extending towards the base portion and into interstices formed by the first plurality of generally planar projections such that one or more apertures are defined that weave around the first and second plurality of generally planar projections; and
a sensor chip mounted to the chip mounting portion of the interposer die, the sensor chip including:
at least three micro-electro-mechanical system (MEMS) gyroscopes; and
at least three MEMS accelerometers.

15. The IMU of claim 14, wherein the first and second plurality of generally planar projections are disposed such that faces of the first plurality of generally planar projections oppose faces of the second plurality of generally planar projections.

16. The IMU of claim 15, wherein opposing faces are 10 microns or less apart from each other, and wherein the base portion of the interposer die and the sensor chip are 10 microns or less apart from each other.

17. The IMU of claim 15, wherein the first and second plurality of generally planar projections are configured to squeeze film dampen movement of the chip mounting portion with respect to the base portion in directions parallel to a plane of the interposer die; and wherein a gap formed between the interposer die and the sensor chip is configured to squeeze film dampen movement of the base portion with respect the sensor chip in a direction orthogonal to the plane of the interposer die.

18. The IMU of claim 14, wherein the first and second plurality of generally planar projections are orthogonal to a plane formed by the interposer die; and wherein a first subset of the first and second plurality of generally planar projections are oriented orthogonal to a first axis in the plane formed by the interposer die and a second subset of the first and second plurality of generally planar projections are oriented orthogonal to a second axis in the plane formed by the interposer die, the second axis orthogonal to the first axis.

19. The IMU of claim 14, wherein the interposer die is mounted to the sensor chip such that a gap is defined between the base portion of the interposer die and the sensor chip, wherein the gap is configured to provide squeeze film damping in a direction perpendicular to a plane of the interposer die.

20. A system comprising:
one or more processing devices;
one or more memory devices coupled to the one or more processing devices, the one or more memory devices including instructions which, when executed by the one or more processing devices, cause the one or more processing devices to perform navigation procedures;
an inertial measurement unit (IMU) mounted to a circuit board and coupled to the one or more processing devices, the IMU including:
an interposer die including:
a base portion mounted to the circuit board;
a chip mounting portion configured to have a chip mounted thereon;
one or more flexures connecting the base portion to the chip mounting portion;
a first plurality of projections extending from the base portion towards the chip mounting portion; and
a second plurality of projections extending from the chip mounting portion towards the base portion and extending into interstices formed by first plurality of projections; and
a sensor chip mounted to the chip mounting portion of the interposer die, the sensor chip including:

at least three micro-electro-mechanical system (MEMS) gyroscopes; and
at least three MEMS accelerometers.

\* \* \* \* \*